US005283534A

United States Patent [19]

Bohlen et al.

[11] Patent Number: 5,283,534

[45] Date of Patent: Feb. 1, 1994

[54] HIGH FREQUENCY AMPLIFYING APPARATUS WITH A COLLECTOR WHICH HAS A PERIODIC AMPLITUDE VARIABLE LONGITUDINAL MAGNETIC FIELD THEREIN

[75] Inventors: Heinz P. Bohlen, Chelmsford; Roy Heppinstall, Witham, both of United Kingdom

[73] Assignee: EEV Limited, Essex, United Kingdom

[21] Appl. No.: 665,548

[22] Filed: Mar. 7, 1991

[30] Foreign Application Priority Data

Mar. 8, 1990 [GB] United Kingdom ................ 9005245

[51] Int. Cl.[5] ..................... H01J 23/027; H01J 23/10; H03F 3/56

[52] U.S. Cl. .................................... 330/45; 315/5.38; 315/5.35; 315/5.39

[58] Field of Search ..................... 315/4, 5, 5.38, 5.35, 315/5.39, 5.37; 330/44, 45

[56] References Cited

U.S. PATENT DOCUMENTS

| | | | |
|---|---|---|---|
| 2,853,641 | 9/1958 | Webber | 315/3.5 |
| 3,175,120 | 3/1965 | Wendt | 315/5.38 |
| 3,297,907 | 1/1967 | LaRue et al. | 315/5.39 |
| 3,394,282 | 7/1968 | Schmidt | 315/5.38 X |
| 3,450,930 | 6/1969 | Lien | 315/5.38 X |
| 3,764,850 | 10/1973 | Kosmahl | 315/5.38 |
| 4,387,323 | 6/1983 | Berwick | 315/5.39 X |
| 4,398,122 | 8/1983 | Gosset | 315/5.38 |
| 4,621,219 | 11/1986 | Fox et al. | 315/5 |
| 4,933,594 | 6/1990 | Faillon et al. | 315/5.38 X |

FOREIGN PATENT DOCUMENTS

| | | | |
|---|---|---|---|
| 0038249 | 10/1981 | European Pat. Off. . | |
| 88977 | 4/1967 | France . | |
| 2103084 | 4/1972 | France . | |
| 198636 | 11/1984 | Japan | 315/5.38 |
| 800580 | 8/1958 | United Kingdom . | |
| 817283 | 7/1959 | United Kingdom . | |
| 909558 | 10/1962 | United Kingdom . | |
| 1177947 | 1/1970 | United Kingdom . | |
| 1430005 | 3/1976 | United Kingdom . | |
| 2128014 | 4/1984 | United Kingdom . | |
| 0324667 | 7/1989 | United Kingdom . | |

OTHER PUBLICATIONS

Patent Abstracts of Japan, vol. 13, No. 2 (E-700) Jan. 6, 1989 & JP-A-63 213 243 (NEC Corp.) Abstract.

*Primary Examiner*—Benny T. Lee
*Attorney, Agent, or Firm*—Spencer, Frank & Schneider

[57] ABSTRACT

In a klystron, or other device which uses modulation of an electron beam to produce amplification of an applied high frequency signal, a collector is used to receive electrons of the beam after the amplified signal has been coupled from the device. Any secondary electrons produced by the impact of high energy electrons on the collector surface are prevented from returning back along the klystron by a periodic magnetic field produce by magnets which coaxially surround the collector.

8 Claims, 3 Drawing Sheets

HIGH FREQUENCY AMPLIFYING APPARATUS WITH A COLLECTOR WHICH HAS A PERIODIC AMPLITUDE VARIABLE LONGITUDINAL MAGNETIC FIELD THEREIN

FIELD OF THE INVENTION

This invention relates to high frequency amplifying apparatus and more particularly to those devices in which amplification of an applied high frequency signal is achieved by modulating an electron beam.

BACKGROUND OF THE INVENTION

There are several types of devices in which amplification of an applied high frequency signal may be achieved by producing modulation of an electron beam. For example, in a klystron, the signal to be amplified is coupled into an input resonant cavity and produces an electric field which acts on electrons of the beam to modify their velocity and produce bunching. There are usually several subsequent resonant cavities which enable the degree of bunching to be enhanced and a final resonant cavity at which the amplified signal is extracted. After the final cavity, the electrons are directed towards a collector section where they impact on a surface.

Another class of amplifying apparatus, is that known as an inductive output tetrode (IOT), such as a "Klystrode", which is a trade mark of Varian Associates. Such a device employs density modulation of the electron beam and also includes a collector section similar to that used in klystrons.

The electrons which reach the collector are of relatively high energy and their impact on its surfaces tends to result in the production of secondary electrons. The secondary electrons may travel in the opposite direction to the electrons of the beam and may return far enough along the klystron, IOT or other device to interfere with its operation and cause deterioration in performance.

The collector may be operated in what is termed a "depressed" mode, in which it is held at a negative potential in order to improve the operating efficiency of the device. The collector may be of the multistage type, having a number of electrodes which are maintained at respective different negative voltages. However, because the collector is maintained at a negative potential, any secondary electrons which are emitted tend to be accelerated along the tube towards the final resonant cavity.

SUMMARY OF THE INVENTION

The present invention arose from an attempt to provide improved amplifying apparatus.

According to the invention there is provided a high frequency amplifying apparatus comprising: means for modulating an electron beam to produce amplification of an applied high frequency signal; a resonant cavity from which the amplified high frequency signal is extracted; a collector for receiving electrons of the beam after the amplified signal has been extracted; and means for producing a magnetic field at the region between the resonant cavity and the collector, the amplitude of the magnetic field changing with distance along the electron beam path. The magnetic field may be produced along the length of the collector for example, or could extend as far as the resonant cavity or extend, say, from the resonant cavity to the beginning of the collector.

By employing the invention, electrons travelling from the collector towards the resonant cavity tend to be suppressed. The magnetic field is preferably periodic, such that its amplitude reaches at least one maximum and minimum. It may be arranged such that its periodic variation along the electron beam tends to deflect secondary electrons produced at the collector towards the collector surfaces, thus preventing their return to the final resonant cavity.

In a preferred embodiment of the invention, the magnetic field has the same polarity along the electron beam path, giving good focussing. In another embodiment, the magnetic field changes polarity with distance along the beam path.

It is preferred that the collector is operated in a depressed mode to give good operating efficiency, the invention being particularly useful in such an arrangement. The collector may be of the single stage or multistage type.

The invention is applicable to all types of amplifying apparatus in which an electron beam is modulated and is received by a collector after the amplified signal has been coupled from a resonant cavity, such as, for example, klystrons, IOTs and travelling wave tubes.

BRIEF DESCRIPTION OF THE DRAWINGS

Some ways in which the invention may be performed are now described by way of example with reference to the accompanying drawings in which.

FIGS. *2a* and *2b* are explanatory diagrams relating to the operation of the IOT of FIG. 2.

DESCRIPTION OF PREFERRED EMBODIMENTS

Figure 1:
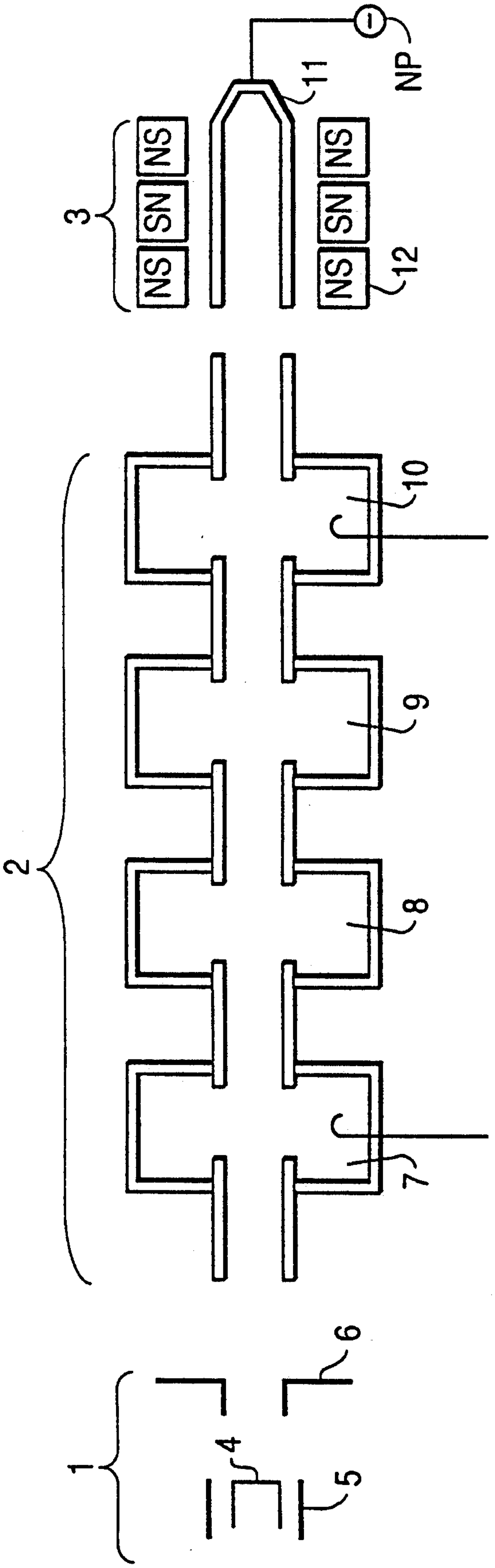
FIG. 1 schematically illustrates a klystron in accordance with the invention.

With reference to FIG. 1, a klystron includes an electron beam generating section 1, an interaction section 2 and a collector section 3, the collector being arranged to operate in a depressed mode by holding it at a negative potential NP.

An electron beam is generated at a cathode 4, which is surrounded by a focussing electrode 5, and is transmitted via modulating electrode 6 into the interaction region 2. An r.f. signal which is to be amplified is coupled into a first resonant cavity 7 in the interaction region 2. The electric field produced across the electron beam results in velocity modulation of the electrons to produce bunching. Subsequent cavities 8, 9 and 10 result in increased bunching of the electrons. The amplified r.f. signal is coupled out of the final resonant cavity 10.

The electron beam is received by the collector section 3, the electrons of the beam impinging on the metal surface of the collector 11. The cylindrical collector 11 is coaxially surrounded by permanent magnets 12 which are arranged to produce a periodic magnetic field along the collector section, the polarity of the field changing at intervals along the beam path. Any secondary electrons which are produced by the impact of high energy electrons in the beam are subjected to the magnetic field produced by the material 12 and thus tend to be prevented from returning back along the klystron.

Figure 2:
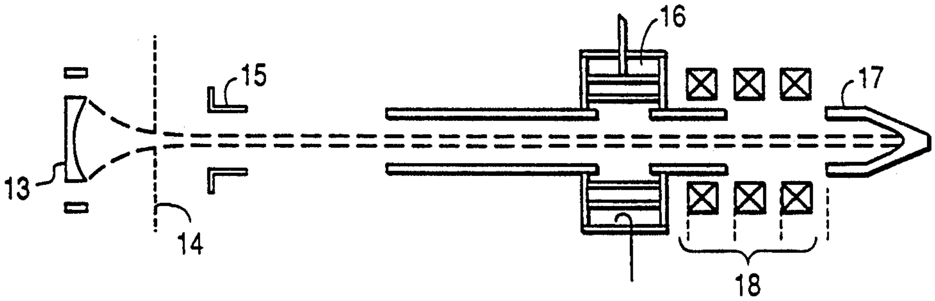
FIGS. 2 schematically illustrates an IOT in accordance with the invention.
Figure 2A:
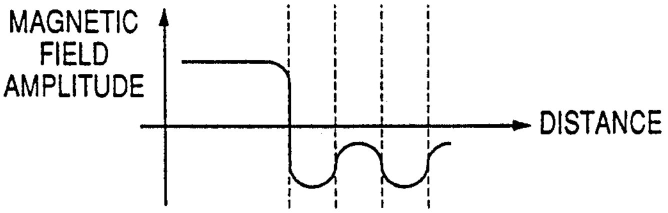
Figure 2B:
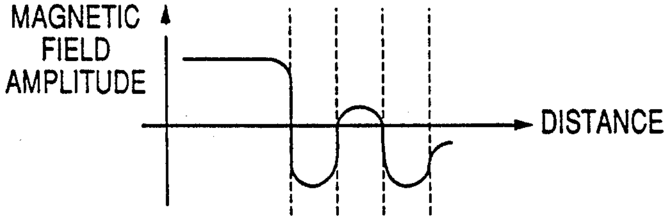

With reference to FIG. 2, an IOT includes a cathode 13 and a modulating grid 14 for modulation, an applied r.f. signal, which together produce a density modulated electron beam. After acceleration by an electrode 15, the electrons of the beam arrive at a resonant cavity 16 at which an amplified signal is extracted. The electrons are incident on the surfaces of a collector 17 which is surrounded by coils 18. The coils 18 are arranged to produce a magnetic field in a region which extends from the cavity 16 to along part of the length of the collector 17.

In one mode of operation, the current through each of the coils 18 is in the same polarity and hence the resultant magnetic field also does not change direction along the electron beam path. A smaller current is passed through the central coil of the three such that the magnetic field periodically varies in amplitude, as illustrated in FIG. *2a*, where the ordinate is the amplitude of the magnetic field and the abscissa corresponds to the distance along the IOT.

In another mode of operation, the current through the central coil is in the reverse direction to that through the other coils, causing the resultant magnetic field to change polarity, as illustrated in FIG. *2b*.

Figure 3:
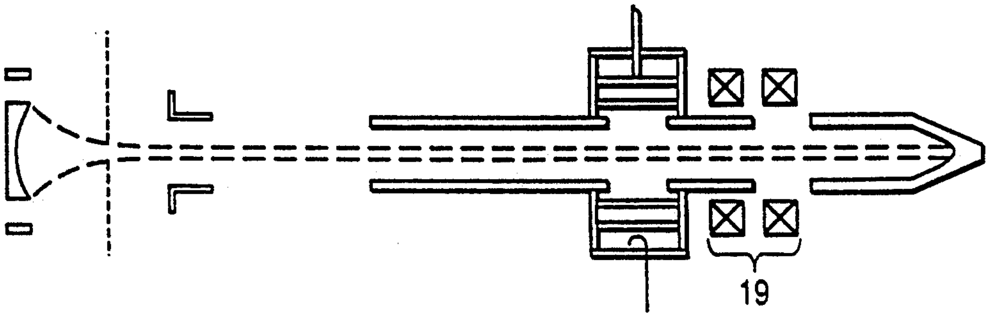
FIGS. 3, 4 and 5 illustrate further IOTs in accordance with the invention.

With reference to FIG. 3, there is illustrated another IOT similar to that illustrated in FIG. 2, but in this apparatus a periodic magnetic field is produced in the region between the resonant cavity and the beginning of the collector, by two coils 19.

Figure 4:
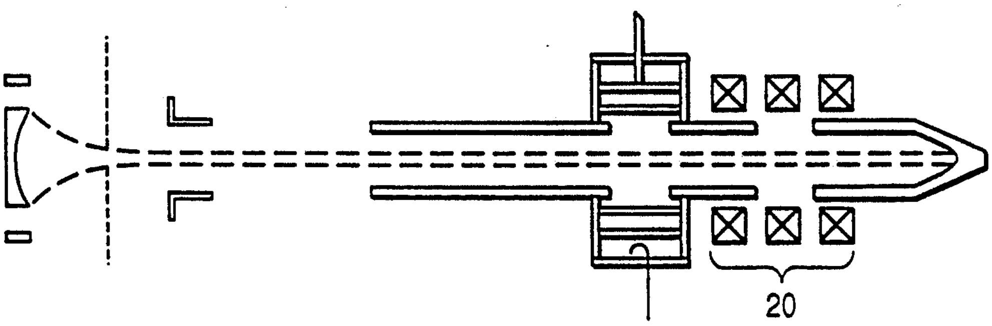

FIG. 4 illustrates an IOT in which the magnetic field produced by surrounding coils 20 extends into the collector region by way of the final coil surrounding the collector.

Figure 5:
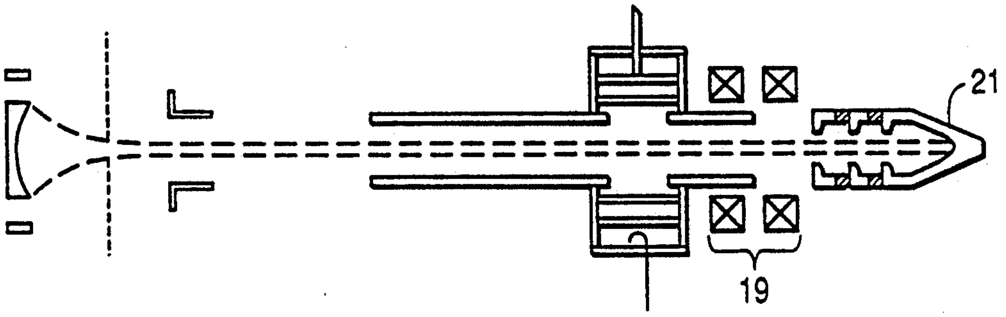

FIG. 5 illustrates an embodiment of the invention in which the IOT has a multi-stage collector 21, in which elements of the collector are maintained at respective different voltages.

Of course, the magnetic field for a klystron could be produced by coils and that for an IOT by permanent magnets.

We claim:

1. A high frequency amplifying apparatus, comprising:

means for producing an electron beam and for directing the electron beam along a path in a longitudinal direction of the apparatus;

means operatively arranged for modulating the electron beam with a high frequency signal;

a resonant cavity through which the modulated electron beam is directed, whereby the modulated electron beam interacts with said resonant cavity to generate an amplified high frequency signal;

means operatively arranged with said resonant cavity for extracting the amplified high frequency signal from the modulated electron beam in said resonant cavity;

a collector disposed adjacent said resonant cavity for receiving the electron beam after the amplified high frequency signal has been extracted; and means for producing, within a region extending from said resonant cavity to said collector, a magnetic field substantially in the longitudinal direction of the apparatus, said magnetic field having solely one polarity along the path of the electron beam and an amplitude that varies periodically with distance in the direction of the path of the electron beam.

2. The apparatus as defined in claim 1, wherein said apparatus comprises an inductive output tetrode.

3. The apparatus as defined in claim 1, wherein said resonant cavity comprises a plurality of coupled resonant cavities and said apparatus comprises a klystron.

4. The apparatus as defined in claim 1, wherein said collector is elongated in the direction of the path of the electron beam and said producing means produces the magnetic field between said resonant cavity and an end of said collector adjacent said resonant cavity.

5. The apparatus as defined in claim 1, wherein said collector has a length in the direction of the path of the electron beam and said producing means produces the magnetic field only along the length of said collector.

6. The apparatus as defined in claim 1, wherein said collector comprises a multi-stage collector.

7. The apparatus as defined in claim 1, wherein said producing means comprises coils for producing the magnetic field.

8. The apparatus as defined in claim 1, further comprising means for holding said collector at a negative potential so that said collector operates in a depressed mode.

* * * * *